(12) United States Patent
Chang et al.

(10) Patent No.: US 6,310,397 B1
(45) Date of Patent: Oct. 30, 2001

(54) BUTTED CONTACT RESISTANCE OF AN SRAM BY DOUBLE VCC IMPLANTATION

(75) Inventors: Yeong-Kong Chang; Hung-Che Liao, both of Hsin-Chu (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/534,552

(22) Filed: Mar. 27, 2000

Related U.S. Application Data

(62) Division of application No. 09/127,462, filed on Jul. 31, 1998, now Pat. No. 6,057,186.

(51) Int. Cl.[7] .................................................. H01L 23/48
(52) U.S. Cl. ........................... 257/756; 257/754; 257/755
(58) Field of Search ..................................... 257/754–756

(56) References Cited

U.S. PATENT DOCUMENTS

| | | | |
|---|---|---|---|
| 5,393,687 | 2/1995 | Liang | 437/46 |
| 5,596,215 | 1/1997 | Huang | 257/344 |
| 5,607,881 | 3/1997 | Huang | 437/195 |
| 5,668,051 | 9/1997 | Chen et al. | 438/558 |
| 5,686,334 | * 11/1997 | Sundaresan | 438/152 |
| 5,751,044 | * 5/1998 | Lee | 257/380 |
| 6,107,642 | * 8/2000 | Sundaresan | 257/67 |
| 6,239,458 | * 5/2001 | Liaw et al. | 257/296 |

* cited by examiner

Primary Examiner—Allan R. Wilson
(74) Attorney, Agent, or Firm—George O. Saile; Stephen B. Ackerman; Graham S. Jones, II

(57) ABSTRACT

Form a butted contact in an SRAM memory device by exposing a contact region on the surface of a doped semiconductor substrate and a conductor stack above a field oxide region on the surface of the substrate. Form an interpolysilicon silicon oxide dielectric layer over the device with an opening framing the contact region and the butt end of the conductor stack near the contact region. Form an undoped upper polysilicon layer on the surface of the SRAM device covering the dielectric layer, the contact region, and the butt end of the conductor stack and then patterned into interconnect and load resistance parts. Form a Vcc mask on the surface of the undoped upper polysilicon layer with a window framing the dielectric layer, the contact region, and the butt end of the conductor stack, leaving an exposed region of the undoped upper polysilicon layer. Ion implant a first dose of Vcc dopant through the window into the undoped upper polysilicon layer at a first energy level, and then ion implant a second dose of Vcc dopant through the window into the buried contact region and the butt end of the conductor stack layer at a higher energy level than the first energy level.

3 Claims, 4 Drawing Sheets

BUTTED CONTACT RESISTANCE OF AN SRAM BY DOUBLE VCC IMPLANTATION

This is a division of patent application Ser. No. 09/127,462, filing date Jul. 31, 1998, A Method For Improving The Butted Contact Resistance Of An Sram By Double Vcc Implantation And Sram Device Manufactured Thereby, now U.S. Pat. No. 6,057,186 assigned to the same assignee as the present invention.

BACKGROUND OF THE INVENTION

1. Field of the Invention

This invention relates to contact resistance of butted contacts in semiconductor memory devices and more particularly to butted contacts in SRAM devices.

2. Description of Related Art

It is difficult to reduce butted contact resistance in sub-half micron SRAM devices because of Si/Si or Si/WSix interfaces. A high resistance node sometimes acts to contribute to killing the yield of a manufacturing process.

U.S. Pat. No. 5,607,881 of Huang for "Method of Reducing Buried Contact Resistance in SRAM" shows an extra ion implant into a trench but not into the polysilicon. A buried contact is formed within a semiconductor substrate by dopant diffusion from an overlying polysilicon layer. The second polysilicon layer is patterned to form a polysilicon contact overlying the buried contact junction wherein a portion of the buried contact within said semiconductor substrate is exposed. The polysilicon layer is overetched whereby a trench is etched into the exposed semiconductor substrate. An extra implant is implanted into the semiconductor substrate around the trench.

U.S. Pat. No. 5,393,687 of Liang for "Method of Making Buried Contact Module with Multiple Poly Si Layers" teaches a method of making buried contact module with multiple polysilicon layers.

U.S. Pat. No. 5,596,215 of Huang for "Method to Improve Buried Contact Resistance" teaches a method for filling a conductive trench in a buried contact.

U.S. Pat. No. 5,668,051 of Chen et al for "Method of Forming Poly Plug to Reduce Buried Contact Resistance" describes driving dopant from a second polysilicon layer to form a buried contact junction and etching away the second polysilicon layer where a planned source/drain region will be formed adjacent to the buried contact junction.

An object of this invention is to reduce butted contact resistance because of lower resistivity in the contact area.

SUMMARY OF THE INVENTION

A two stage, lower energy/higher energy phosphorous implantation is performed at the Vcc implantation stage. The first implantation is performed at an energy of 35 keV, followed by an second more penetrating implant at an energy of 50 keV. This extra implantation depth should be aimed at the contact interface to add extra P type impurity within this area. Butted contact resistance is reduced because of lower resistivity in the contact area. The reduction of contact resistance enhances the immunity of SRAM devices, if low resistance is required for the butted contacts.

A device in accordance with this invention is provided by a method, also in accordance with this invention, of forming a butted contact in an SRAM memory device comprises providing the SRAM memory device with a butted contact exposing a contact region on the surface of a doped semiconductor substrate and a conductor stack above a field oxide region on the surface of the substrate. Form an interpolysilicon silicon oxide dielectric layer on the surface of the device with an opening framing the contact region and the butt end of the conductor stack adjacent to the contact region. Form an undoped upper polysilicon layer on the surface of the SRAM device covering the interpolysilicon silicon oxide dielectric layer, the contact region, and the butt end of the conductor stack. Pattern the undoped upper polysilicon into interconnect and load resistance parts. Form a Vcc mask with an open window framing framing the interconnect part of the undoped upper polysilicon layer, the contact region, and the butt end of the conductor stack. Ion implant a first dose of Vcc dopant through the window into the upper polysilicon layer at a first energy level, and then ion implant a second dose of Vcc dopant through the window into the buried contact region and the butt end of the conductor stack layer at a higher energy level than the first energy level.

Preferably, the upper polysilicon layer is implanted with the first dose comprising phosphorus of from about 2 E 15 ions/cm$^2$ to about 6 E 15 ions/cm$^2$ at an energy from about 30 keV to about 40 keV, preferably about 4 E 15 ions/cm$^2$ Vcc dopant at an energy of 35 keV. After annealing the phosphorus dopant in the upper polysilicon layer has a concentration of is from about 2 E 20 atoms/cm$^3$ to about 6 E 20 atoms/cm$^3$, and the buried contact region and the butt end of the conductor stack are implanted with the second dose of about 4 E 15 ions/cm$^2$ Vcc of phosphorus dopant an energy from about 45 keV to about 55 keV, preferably at an energy of 50 keV, and after annealing the concentration of phosphorus dopant in the upper polysilicon layer is from about 2 E 20 atoms/cm$^3$ to about 6 E 20 atoms/cm$^3$.

After implanting the second dose of Vcc dopant the photoresist layer PR is been stripped from the device.

The next step is to perform load implantation.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
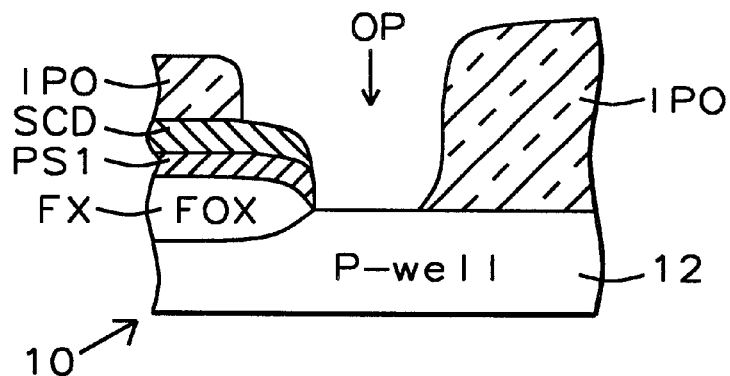
FIG. 1 shows a sectional elevation view of a partially completed butted contact in a portion of an SRAM device being manufactured in accordance with the method of this invention.

FIG. 1 shows a sectional elevation view of a partially completed butted contact in a portion of an SRAM device 10 being manufactured in accordance with the method of this invention. The device 10 is formed on a P-well 12 in an N-doped substrate on which a field oxide (FOX) region FX has been formed with a polycide conductor stack PS1/SCD formed above the FOX region FX. A polysilicon conductor layer PS1 and a tungsten silicide (WSix) layer SCD are stacked in that order on the top surface of FOX region,FX.

In particular, the polycide stack comprises a first, doped polysilicon conductor layer PS1 with a thickness from about 800 Å to about 1400 Å formed on the top surface of the FOX region FX. The layer PS1 is doped to the usual amount required for a polysilicon conductor, as is well understood by those skilled in the art. After annealing the concentration of phosphorus dopant in the polysilicon conductor layer PS1 was from about 2 E 20 atoms/cm$^3$ to about 6 E 20 atoms/cm$^3$.

The WSix layer SCD, with a thickness from about 800 Å to about 1200 Å, was formed on the top surface of the first, doped polysilicon conductor layer PS1.

Above the tungsten silicide layer SCD and above the P-well 12 an interpolysilicon silicon oxide dielectric layer IPO has been formed with a butted contact opening OP exposing the edge of the conductor stack SCD/PS1 and the FOX regions FX and the exposed surface portion ES of the surface of P-well 12 adjacent to the FOX region FX at the bottom of opening OP.

Figure 2:
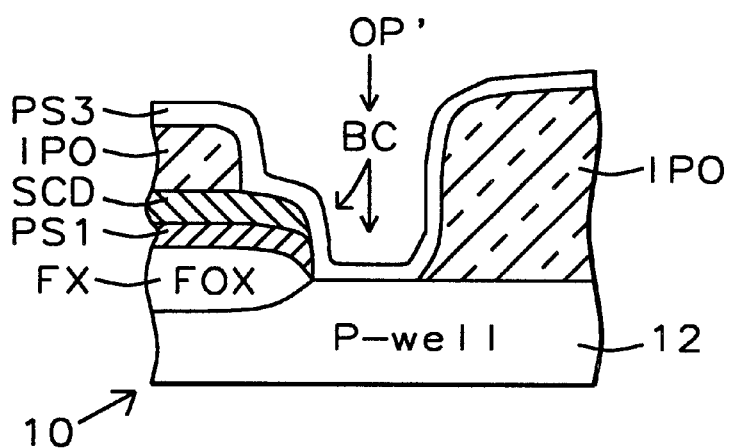
FIG. 2 shows the device of FIG. 1 after a blanket, third undoped polysilicon layer has been formed over the top surface of the dielectric layer, the exposed edge of the conductor stack and the FOX region and the exposed surface portion of substrate and then be patterned.

FIG. 2 shows the device 10 of FIG. 1 after a blanket, third undoped polysilicon layer PS3 has been formed over the top surface of the dielectric layer IPO, the exposed edge of the conductor stack SCD/PS1 and the FOX reg ion FX and the exposed surface portion ES of P-well 12 and then be patterned into interconnect and load resistance parts. Layer PS3 forms a butted contact BC with the conductor stack SCD/PS1 and the exposed surface portion ES. The third undoped polysilicon layer PS3 has a thickness from about 400 Å to about 700 Å. The opening OP has been modified by third undoped polysilicon layer PS3 to form a narrower opening OP'.

A second, doped, polysilicon layer (not seen in this view) is present in other portions of the device 10, provided in a conventional manner, as will be well understood by those skilled in the art.

A step of definition of third doped polysilicon layer PS3 is performed in the conventional manner.

While the third undoped polysilicon layer PS3 forms a butted electrical and mechanical contact BC with the conductor stack SCD/PS1 and the exposed surface portion ES, the resistance is too high, so the conductivity of the layer PS3 needs to be enhanced in the region of the butted contact BC. The butted contact region BC is formed where the undoped polysilicon layer PS3 is shown in direct contact with the P-well 12 in FIGS. 2–5.

Figure 3:
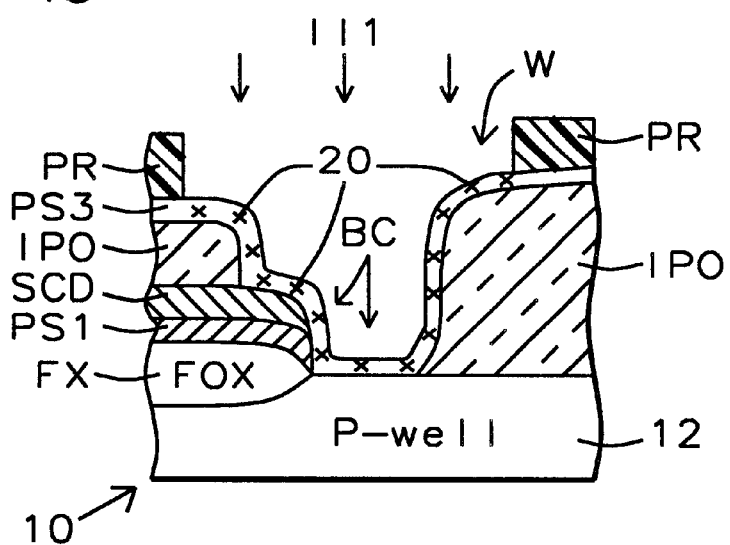
FIG. 3 shows the device of FIG. 2 after a Vcc implantation photoresist mask PR has been formed above the dielectric layer on the patterned wafer.

FIG. 3 shows the device 10 of FIG. 2 after a Vcc implantation photoresist mask PR has been formed above the dielectric layer IPO on the surface of the third undoped polysilicon layer PS3. Mask PR has a window W therethrough framing the space above the opening OP'. Mask PR is to be employed during two photolithographic patterning steps of Vcc implantation.

The first Vcc implantation step is illustrated by the first Vcc ion implantation step in which phosphorus ions II1 are implanted through window W into the third doped polysilicon layer PS3. Preferably, phosphorus, P type dopant 20, is implanted at an energy of about 35 keV, with a dose of about 4E15 ions/cm$^2$). In general, polysilicon layer PS3 is ion implanted with a dose of phosphorus dopant 20 from about 2 E 15 ions/cm$^2$ to about 6 E 15 ions/cm$^2$ at an energy from about 30 keV to about 40 keV. After annealing the concentration of phosphorus dopant 20 in the polysilicon layer PS3 was from about 2 E 20 atoms/cm$^3$ to about 6 E 20 atoms/cm$^3$.

Figure 4:
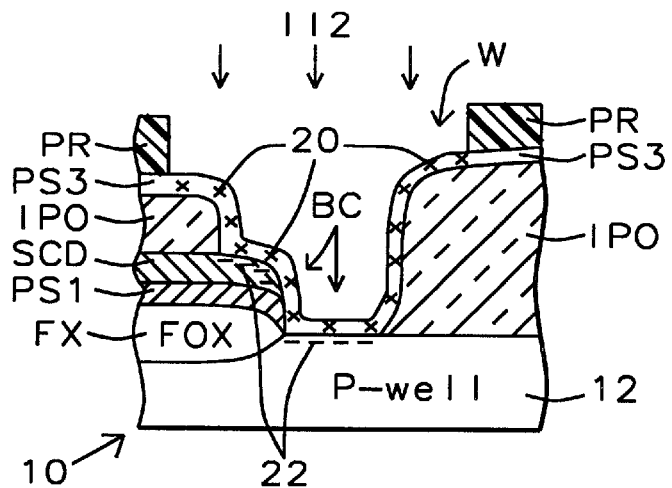
FIG. 4 shows the device of FIG. 3 after the second Vcc implantation through the same photoresist mask PR into the substrate and into the edges of the layers in the conductor stack which were previously exposed in FIG. 1 below the opening in FIG. 1.

FIG. 4 shows the device 10 of FIG. 3 showing the second Vcc implantation through the same photoresist mask PR into the P-well 12 and into the edges of the layers in the conductor stack SCD/PS1 (tungsten silicide layer SCD and polysilicon layer PS1) which were previously exposed in FIG. 1 below the opening OP/OP'. A second Vcc implantation step, which is performed at a higher energy is illustrated in FIG. 4 with Vcc phosphorus ions II2 being implanted through window W into the third doped polysilicon layer PS3 as well as being implanted into P-well 12 leaving dopant 22 therein to reduce the contact resistance between the P-well 12 and the polysilicon layer PS3. Dopant 22 is also implanted into the the butt end of the gate conductor stack adjacent to the contact region BC (layer SCD and the layer PS1 adjacent to the periphery of layer PS3). Preferably, the phosphorus, P type dopant, is implanted at an energy from about 45 keV to about 55 keV (preferably 50 keV), with a dose of about 4E15 ions/cm$^2$. In general, the polysilicon layer PS3 and the contact region are ion implanted with a dose of phosphorus dopant from about 2 E 15 ions/cm$^2$ to about 6 E 15 ions/cm$^2$ at an energy from about 45 keV to about 55 keV. After annealing the concentration of phosphorus dopant in the polysilicon layer PS3 was from about 2 E 20 atoms/cm$^3$ to about 6 E 20 atoms/cm$^3$ and the dopant in regions 22 and contact region BC in the P-well are within the same range from about 2 E 20 atoms/cm$^3$ to about 6 E 20 atoms/cm$^3$.

Figure 5:
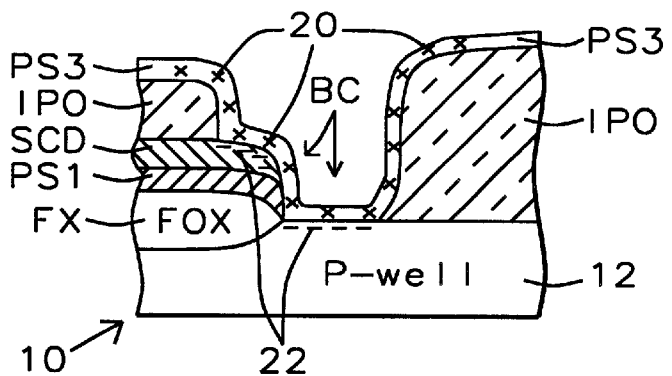
FIG. 5 shows the device of FIG. 4 that the photoresist layer has been stripped.

FIG. 5 shows the device 10 of FIG. 4 that the photoresist layer PR has been stripped.

Finally a step of load implantation is performed. The load implantation is performed in a single step blanket ion implantation by a high current ion implanter which implants arsenic (As) ions at an energy of 45 keV with a dose of 4 E 13 ions/cm$^2$ to about 7 E 13 ions/cm$^2$.

Circuit & Cel Layout

Figure 6:
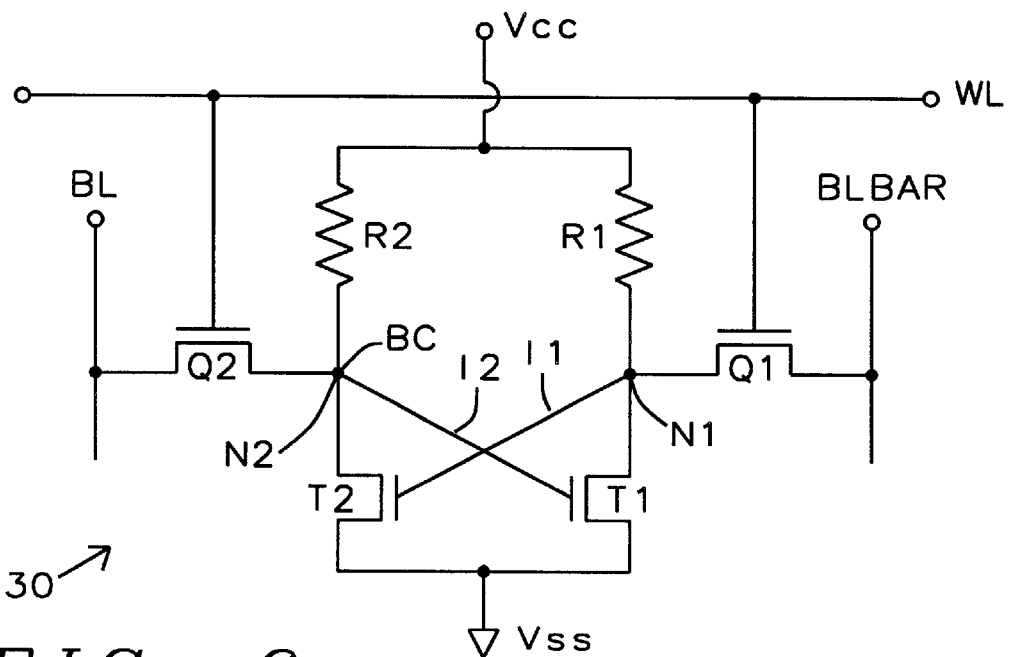
FIGS. 6 shows an equivalent circuit for a 0.35 μm SRAM device.

FIGS. 6 shows an equivalent circuit for a 0.35 μm SRAM device. In FIG. 6, the voltage Vcc is connected to the top ends of pull up device resistors R1/R2 which have been formed from the third polysilicon conductor layer P3, where the dopant levels are lower.

Figure 7:
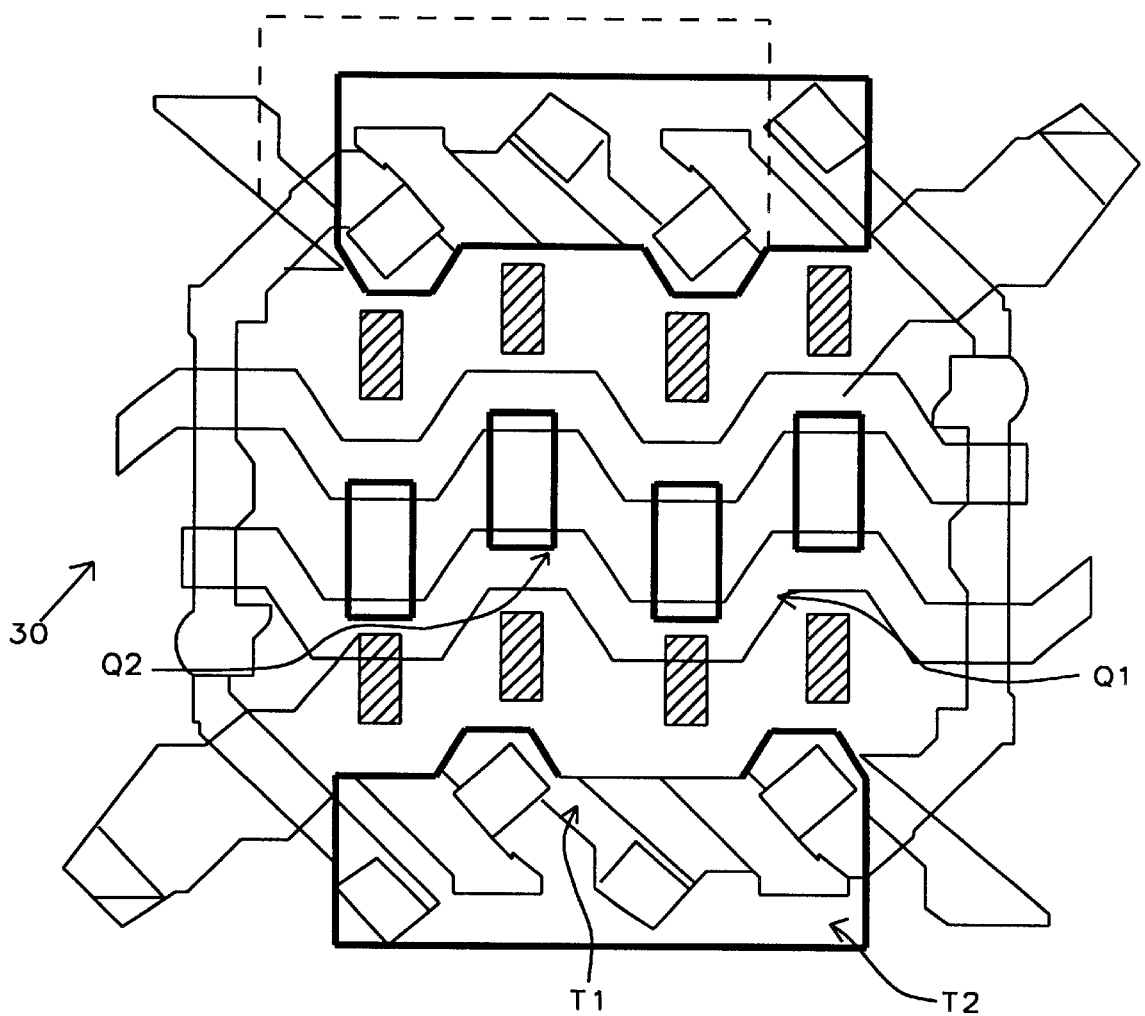
FIG. 7 shows the cell layout for the device of FIGS. 5 and 6.

FIG. 7 shows the cell layout for the device of FIGS. 5 and 6.

The bottom end of the right resistor R1 is connected to node N1 which is connected through to the drain/source circuit of FET pull down FET transistor device T1 to ground potential Vss. The bit line BLBAR is connected through the source/drain circuit of pass gate FET transistor device Q1 to node N1. Node N1 connects to the common drains of transistors T1 and Q1.

The bottom end of the left resistor R2 is connected to node N2/BC which is connected through to the drain/source circuit of pull down FET transistor device T2 to ground potential Vss. The bit line BL is connected through the source/drain circuit of pass gate FET transistor device Q2 to node N2/BC. Node N2 connects to the common drains of transistors T2 and Q2 and the butted contact BC.

The word line (row select) is formed form the first polysilicon layer PS1 and is connected to the gate electrodes of the pass gate transistors Q1/Q2. The node N1 is connected via interconnect line I1 to the gate electrode of pull down transistor T2. The node N2 is connected via interconnect line I2 to the gate electrode of pull down transistor T1. Ground potential Vss is connected to devices formed from the the M1, CT, polysilicon 2 layer, and the SAC. The power supply potential Vcc is connected to devices formed from the the M1, polysilicon 1 layer and polysilicon 3 layer. The location of transistors Q1, Q2, T1 and T2 is seen in the plan view of the device 30 seen in FIG. 7.

The second polysilicon layer P2 (not shown) is used as the bit-line landing pad and Vss strap. The high load resistance makes it possible to achieve a low standby current. (1–100G ohm-cm). The high Beta-ratio is needed to increase the static noise margin.

Figure 8:
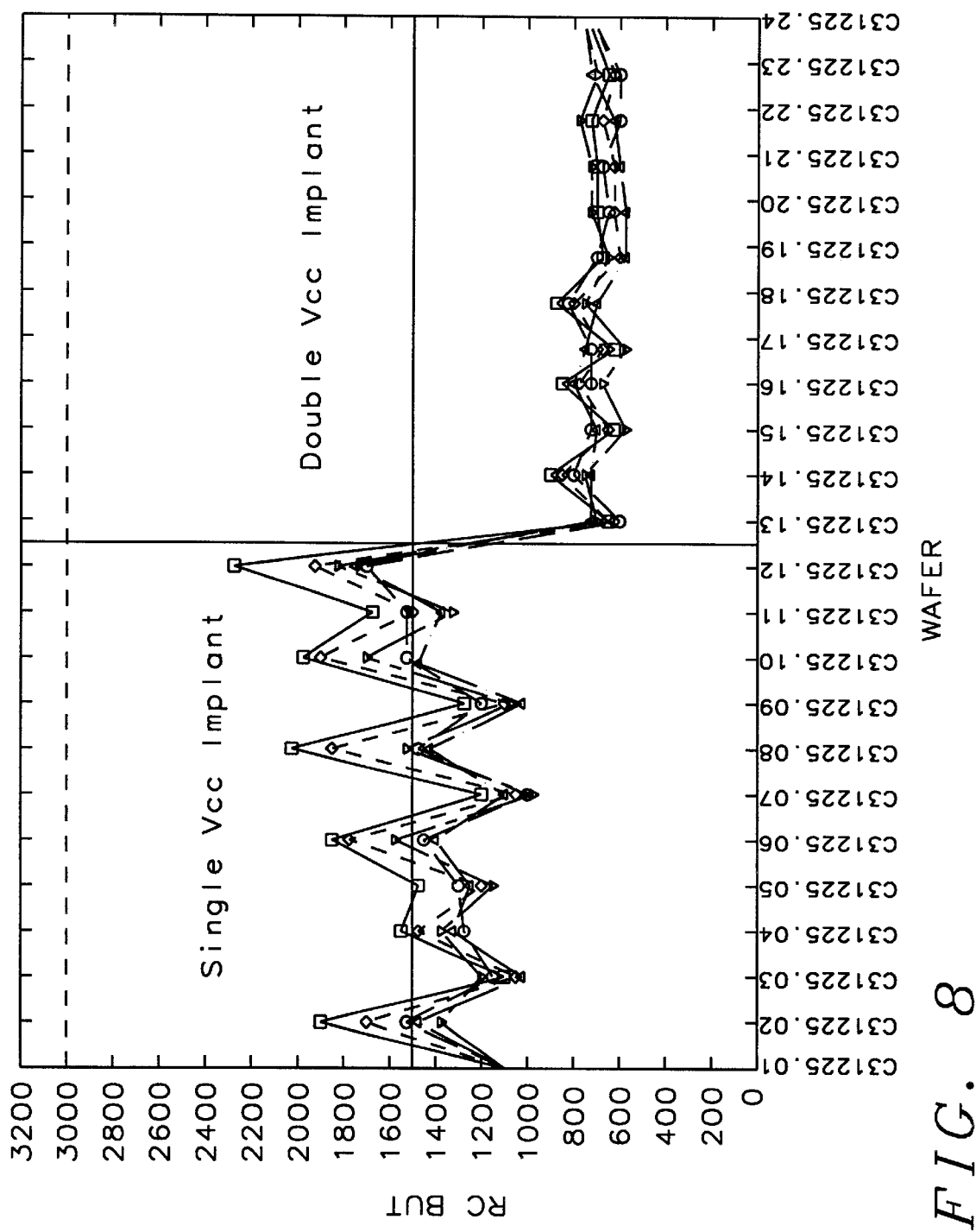
FIG. 8 shows a graph of the resistance of the butt contact, both before and after addition of the second, higher energy Vcc implant.

FIG. 8 shows a graph of the resistance of the butt contact (EDA Rc_BUT) both before and after addition of the second, higher energy Vcc implant with a range of values from about 1100 ohms to about 2200 ohms for several devices a five site trend chart for a twelve devices for the single Vcc implant. The graph also shows the range of values from about 600 ohms to about 800 ohms and twelve other devices for the double Vcc implant on the right side of the chart.

Additional data is found below in Tables I–VI.

TABLE I

| LOT ID: C27007.00 | | | PRODUCT ID: TM4416 | |
|---|---|---|---|---|
| TESTER: DTWA10 | | | PROBER CARD: T36 | |
| TEST PROGRAM: TM4416 | | | LIMIT FILE: TM4416.LIM | |
| parameter | unit | stdx2 | Vcc double | impx17 |
| Isat_N2 F | mA20/0.35 | 10.240/0.097 | 10.257/0.071 | |
| Isat_P2 F | mA20/0.35 | −4.777/0.062 | −4.835/0.110 | |
| JUN_BUT | e-10A STRI | 2.956/0.124 | 3.435/1.033 | |
| Rc_BUT | O/S .4*.6 | 775.200/103.851 | 475.824/92.147 | |
| VT_N2 EXT | V 20/0.35 | 0.651/0.004 | 0.642/0.026 | |
| VT_P2 EXT | V 20/0.35 | −0.776/0.004 | −0.768/0.008 | |

Run time: Wed Nov 19 14:05:04 1997

TABLE II

| LOT ID: C31225.00 | | | PRODUCT ID: TM5628 | |
|---|---|---|---|---|
| TESTER: DTWA08 | | | PROBER CARD: T64 | |
| TEST PROGRAM: TM5628 | | | LIMIT FILE: TM4416.LIM | |
| parameter | unit | stdx12 | Vcc double | impx12 |
| Isat_N2 F | mA20/0.35 | 10.347/0.077 | 10.335/0.071 | |
| Isat_P2 F | mA20/0.35 | −4.985/0.051 | −4.910/0.055 | |
| JUN_BUT | e-10A STRI | 3.564/0.218 | 3.606/0.230 | |
| Rc_BUT | O/S .4*.6 | 1.4e+03/299.797 | 700.117/94.232 | |
| VT_N2 EXT | V 20/0.35 | 0.650/0.004 | 0.645/0.004 | |
| VT_P2 EXT | V 20/0.35 | −0.791/0.004 | −0.793/0.005 | |

Run time: Wed Nov 19 14:02:38 1997

TABLE III

| LOT ID: C61047.00 | | | PRODUCT ID: TM5744 | |
|---|---|---|---|---|
| TESTER: DTWA09 | | | PROBER CARD: T6 | |
| TEST PROGRAM: TM5744 | | | LIMIT FILE: TM4416.LIM | |
| parameter | unit | stdx3 | Vcc double | impx3 |
| Isat_N2 F | mA20/0.35 | 10.077/0.096 | 10.113/0.092 | |
| Isat_P2 F | mA20/0.35 | −4.915/0.058 | −4.937/0.078 | |
| JUN_BUT | e-10A STRI | 5.049/0.234 | 4.653/0.311 | |
| Rc_BUT | O/S .4*.6 | 1.2e+03/193.429 | 566.267/72.489 | |
| VT_N2 EXT | V 20/0.35 | 0.656/0.004 | 0.654/0.004 | |
| VT_P2 EXT | V 20/0.35 | −0.797/0.003 | −0.794/0.006 | |

Run time: Wed Nov 19 13:59:40 1997

TABLE IV

| LOT ID: C25183.00 | | | PRODUCT ID: TM4416 | |
|---|---|---|---|---|
| TESTER: DTWA07 | | | PROBER CARD: T25 | |
| TEST PROGRAM: TM4416 | | | LIMIT FILE: TM4416.LIM | |
| parameter | unit | stdx18 | Vcc double | impx2 |
| Isat_N2 F | mA20/0.35 | 10.162/0.073 | 10.130/0.048 | |
| Isat_P2 F | mA20/0.35 | −4.797/0.047 | −4.778/0.048 | |
| JUN_BUT | e-10A STRI | 3.014/0.157 | 2.962/0.178 | |
| Rc_BUT | O/S .4*.6 | 1e+03/155.449 | 533.800/44.118 | |
| VT_N2 EXT | V 20/0.35 | 0.656/0.005 | 0.661/0.007 | |
| VT_P2 EXT | V 20/0.35 | −0.789/0.006 | −0.792/0.005 | |

Run time: Wed Nov 19 14:22:32 1997
Lot avg yield: 91.0  92.65  92.25

TABLE V

| LOT ID: C25185.00 | | | PRODUCT ID: TM4416 | |
|---|---|---|---|---|
| TESTER: DTWA04 | | | PROBER CARD: T1 | |
| TEST PROGRAM: TM4416 | | | LIMIT FILE: TM4416.LIM | |
| parameter | unit | stdx18 | Vcc double | impx2 |
| Isat_N2 F | mA20/0.35 | 10.128/0.064 | 10.100/0.067 | |
| Isat_P2 F | mA20/0.35 | −4.764/0.061 | −4.803/0.054 | |
| JUN_BUT | e-10A STRI | 3.314/0.160 | 3.166/0.105 | |
| Rc_BUT | O/S .4*.6 | 971.089/257.173 | 495.300/84.360 | |
| VT_N2 EXT | V 20/0.35 | 0.654/0.004 | 0.655/0.004 | |
| VT_P2 EXT | V 20/0.35 | −0.791/0.006 | −0.790/0.006 | |

Run time Wed Nov 19 14:09:58 1997
Lot avg. yield: 88.9  91.25  86.26

TABLE VI

| LOT ID: C27010.00 | | | PRODUCT ID: TM4416 | |
|---|---|---|---|---|
| TESTER: DTWA11 | | | PROBER CARD: T21 | |
| TEST PROGRAM: TM4416 | | | LIMIT FILE: TM4416.LIM | |
| parameter | unit | stdx2 | Vcc double | impx18 |
| Isat_N2 F | mA20/0.35 | 9.929/0.081 | 10.030/0.219 | |
| Isat_P2 F | mA20/0.35 | −4.588/0.058 | −4.611/0.074 | |
| JUN_BUT | e-10A STRI | 2.827/0.160 | 3.662/1.892 | |
| Rc_BUT | O/S .4*.6 | 1.2e+03/227.477 | 749.778/151.824 | |
| VT_N2 EXT | V 20/0.35 | 0.653/0.002 | 0.650/0.007 | |
| VT_P2 EXT | V 20/0.35 | −0.786/0.007 | −0.785/0.007 | |

Run time: Wed Nov 19 14:07:59 1997

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A butted contact in an SRAM memory device comprising:
   an SRAM memory device with a butted contact including:
   a) a contact region on the surface of a doped semiconductor substrate,
   b) a conductor stack above a field oxide region on the surface of said substrate;
   an interpolysilicon silicon oxide dielectric layer on the surface of said device with an opening framing said contact region and a butt end of said conductor stack adjacent to said contact region,
   a doped upper polysilicon layer on the surface of said SRAM device covering said interpolysilicon silicon oxide dielectric layer, said contact region, and the butt end of said conductor stack with a concentration of phosphorus dopant in the upper polysilicon layer from about 2 E 20 atoms/cm$^3$ to about 6 E 20 atoms/cm$^3$,
   a first dose of Vcc dopant implanted into said upper polysilicon layer at a first energy level, and
   ion implanting a second dose of Vcc dopant through a window into said contact region and said butt end of said conductor stack layer at a higher energy level than said first energy level.

2. A butted contact in an SRAM memory device comprising:
   an SRAM memory device with a butted contact including:
   a) a contact region on the surface of a doped semiconductor substrate,
   b) a conductor stack above a field oxide region on the surface of said substrate;
   an interpolysilicon silicon oxide dielectric layer on the surface of said device with an opening framing said contact region and a butt end of said conductor stack adjacent to said contact region,
   a doped upper polysilicon layer on the surface of said SRAM device covering said interpolysilicon silicon oxide dielectric layer, said contact region, and the butt end of said conductor stack,
   a first dose of Vcc dopant implanted into said upper polysillcon layer at a first energy level,
   ion implanting a second dose of Vcc dopant through a window into said contact region and said butt end of said conductor stack layer at a higher energy level than said first energy level,
   said upper polysilicon layer was implanted with said first dose of Vcc dopant comprising phosphorus dopant from about 2 E 15 ionslcm$^2$ to about 6 E 15 ions/cm$^2$ at an energy from about 30 keV to about 40 keV, and after annealing the concentration of phosphorus dopant in the upper polysilicon layer is from about 2 E 20 atoms/cm$^3$ to about 6 E 20 atoms/cm$^3$, and
   said buried contact region and said butt end of said conductor stack were implanted with said second dose of Vcc dopant comprising phosphorus dopant from about 2 E 15 ions/cm$^2$ to about 6 E 15 ions/cm$^2$ at an energy from about 45 keV to about 65 keV.

3. A butted contact in an SRAM memory device comprising:
   an SRAM memory device with a butted contact including:
   a) a contact region on the surface of a doped semiconductor substrate,
   b) a conductor stack above a field oxide region on the surface of said substrate;
   an interpolysilicon silicon oxide dielectric layer on the surface of said device with an opening framing said contact region and a butt end of said conductor stack adjacent to said contact region,
   a doped upper polysilicon layer on the surface of said SRAM device covering said interpolysilicon silicon oxide dielectric layer, said contact region, and the butt end of said conductor stack,
   a first dose of Vcc dopant implanted into said upper polysilicon layer at a first energy level,
   ion implanting a second dose of Vcc dopant through a window into said contact region and said butt end of said conductor stack layer at a higher energy level than said first energy level,
   said upper polysilucon layer was implanted with said first dose of about 4 E 15 ions/cm$^2$ Vcc dopant comprising phosphorus at an energy of 35 keV and after annealing the concentration of phosphorus dopant in the upper polysilicon layer is from about 2 E 20 atoms/cm$^3$ to about 6 E 20 atoms/em$^3$, and
   said buried contact region and said butt end of said conductor stack were implanted with said second dose of about 4 E 15 ions/cm$^2$ Vcc dopant comprising phosphorus dopant at an energy of 50 keV.

* * * * *